United States Patent
Hara et al.

(10) Patent No.: US 7,112,242 B2
(45) Date of Patent: Sep. 26, 2006

(54) MANUFACTURING METHOD FOR PRODUCING SILICON CARBIDE CRYSTAL USING SOURCE GASES

(75) Inventors: Kazukuni Hara, Kasugai (JP); Masao Nagakubo, Nishikamo-gun (JP); Shoichi Onda, Toyokawa (JP)

(73) Assignee: Denso Corporation, Kariya (JP)

( * ) Notice: Subject to any disclaimer, the term of this patent is extended or adjusted under 35 U.S.C. 154(b) by 114 days.

(21) Appl. No.: 10/872,365

(22) Filed: Jun. 22, 2004

(65) Prior Publication Data
US 2004/0231583 A1 Nov. 25, 2004

Related U.S. Application Data (62) Division of application No. 09/985,120, filed on Nov. 1, 2001, now Pat. No. 6,830,618.

(30) Foreign Application Priority Data
Nov. 10, 2000 (JP) ............................. 2000-343664

(51) Int. Cl.
C30B 29/36 (2006.01)
(52) U.S. Cl. ............................. 117/84; 117/86; 117/951
(58) Field of Classification Search ................. 117/200, 117/900, 951, 84, 88, 86; 118/725, 715
See application file for complete search history.

(56) References Cited

U.S. PATENT DOCUMENTS

| | | | | |
|---|---|---|---|---|
| 5,288,326 A | | 2/1994 | Maeda et al. | |
| 5,683,507 A | * | 11/1997 | Barrett et al. | 117/200 |
| 5,704,985 A | * | 1/1998 | Kordina et al. | 118/725 |
| 5,707,446 A | * | 1/1998 | Volkl et al. | 117/200 |
| 5,879,462 A | * | 3/1999 | Kordina et al. | 118/725 |
| 6,030,661 A | * | 2/2000 | Kordina et al. | 427/248.1 |
| 6,039,812 A | | 3/2000 | Ellison et al. | |
| 6,048,398 A | * | 4/2000 | Vehanen et al. | 117/200 |
| 6,056,820 A | | 5/2000 | Balakrishna et al. | |
| 6,063,185 A | * | 5/2000 | Hunter | 117/84 |
| 6,406,539 B1 | | 6/2002 | Shigeto et al. | |
| 6,451,112 B1 | * | 9/2002 | Hara et al. | 117/101 |
| 2001/0052324 A1 | * | 12/2001 | Rupp et al. | 118/728 |

FOREIGN PATENT DOCUMENTS

| | | |
|---|---|---|
| JP | A-H05-214412 | 8/1993 |
| JP | A-11-035395 | 2/1999 |
| WO | WO 00/43577 | 7/2000 |

* cited by examiner

*Primary Examiner*—James P. Mackey
(74) *Attorney, Agent, or Firm*—Posz Law Group, PLC (57) ABSTRACT

A crucible, which has first member and second cylindrical body, is disposed in a lower chamber. A pedestal is disposed inside the first member, and a seed crystal is fixed to the pedestal. A second heat insulator is provided between an inlet conduit and a crucible. A first heat insulator is provided at a halfway portion of the inlet conduit. With these heat insulators, a temperature gradient occurs in the inlet conduit at a portion thereof that is closer to the crucible. A mixture gas is introduced into the crucible. The mixture gas is heated up gradually when passing through the inlet conduit and is introduced into the crucible to form SiC single crystals in high quality.

14 Claims, 4 Drawing Sheets

MANUFACTURING METHOD FOR PRODUCING SILICON CARBIDE CRYSTAL USING SOURCE GASES

CROSS REFERENCE TO RELATED APPLICATION

This application is a divisional application of U.S. patent application Ser. No. 09/985,120, which was filed on Nov. 1, 2001 now U.S. Pat. No. 6,830,618. Further, this application is based upon Japanese Patent Application No. 2000-343664 filed on Nov. 10, 2000, the contents of which are incorporated herein by reference.

BACKGROUND OF THE INVENTION

1. Field of the Invention

The present invention relates to manufacturing method for producing single-crystal silicon carbide that has low defects and high quality, and apparatus suitable for the same.

2. Related Art

Silicon carbide (SiC) has been developed as a semiconductor substrate for a power device because SiC has characteristics such as withstanding high voltage and high electron mobility. Generally, the single-crystal SiC is produced by a single crystal growth method called sublimation (the Modified Lely Method).

In the Modified Lely Method, silicon carbide source material is held in a graphite crucible, and a seed crystal is held in the graphite crucible to face the source material. The source material is heated to approximately 2200 to 2400° C., generating sublimed gas. The temperature of the seed crystal is kept lower than the source material by several tens up to several hundred degrees Celsius, causing the sublimed gas to recrystallize on a growth surface of the seed crystal and forming single SiC crystals.

However, there is a limit to growth with the Modified Lely Method as the source material decreases with the growth of single SiC crystals. Although new source material can be added, SiC is sublimed at a rate in which the ratio of Si to C is more than one, so that the concentration of the sublimed gas vacillates when the new source material is added in the growth process, thereby preventing high quality single SiC crystal growth.

Figure 4:
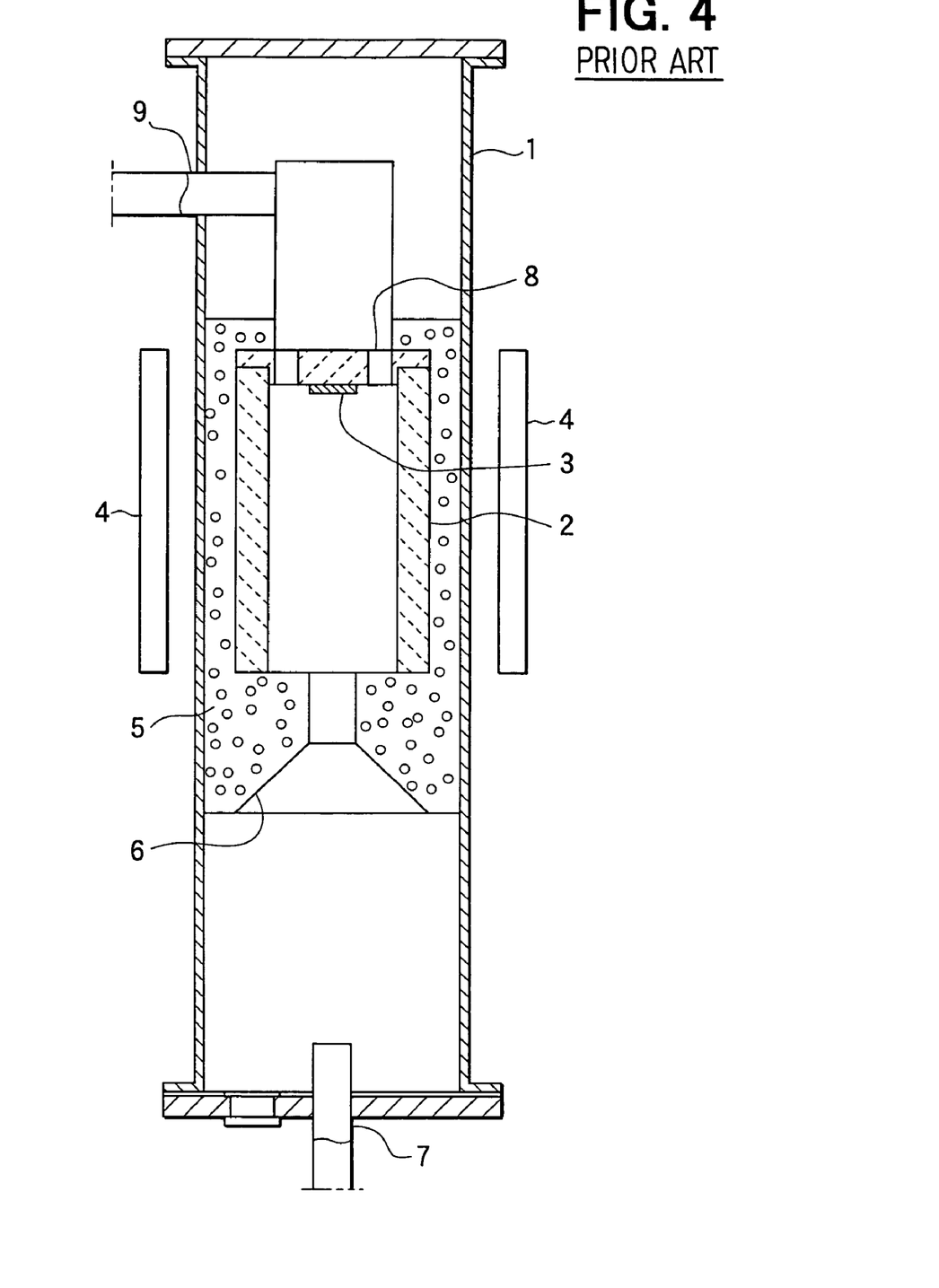
FIG. 4 is a schematic cross sectional view of a manufacturing apparatus in the prior art.

An epitaxial growth method of single SiC crystals by Chemical Vapor Deposition (CVD) is disclosed in JP-A-11-508531 (U.S. Pat. No. 5,704,985). FIG. 4 shows a schematic cross sectional view of an apparatus for the epitaxial growth method described in the above-mentioned publication. As shown in FIG. 4, a susceptor 2 is used as a crucible and is disposed approximately at the center of a cylindrical case 1. The susceptor 2 is composed of high-purity graphite or the like. The SiC single crystal substrate is a seed crystal and is disposed on an upper, inner surface of the susceptor 2 to promote epitaxial growth. A heater 4 is provided at an outside portion of the case 1 to heat gases inside the susceptor 2.

The space surrounding the susceptor 2 is filled with a thermal insulator 5 composed of porous graphite. An inlet conduit 6, which is formed by the thermal insulator 5 and which has a funnel shape, is located under a bottom of the susceptor 2. A supplying portion 7 is located at a bottom of the case 1 to supply a mixture gas while outlet conduits 8 are disposed at a top of the susceptor 2 to exhaust the mixture gas. A conduit 9 is disposed at the upper side of the case 1 and communicates with the outside of the case 1.

In the apparatus described above, the mixture gas supplied by the supplying portion 7 is transferred to the susceptor 2 through the inlet conduit 6 formed by the thermal insulator 5. The gas mixture is heated by the heater 4 and epitaxial growth occurs on the seed crystal 3 to form a single silicon carbide crystal. Any remaining gas mixture is exhausted through the outlet conduits 8 disposed at the top of the susceptor 2 and the conduit 9, which is disposed at the upper side of the case 1.

However, in the CVD manufacturing method for producing a single silicon carbide crystal the inlet conduit 6 is composed of the graphite 5, and the heat from the susceptor 2 tends not to be transmitted to the inlet conduit 6. Therefore, the temperature of the gas mixture in the inlet conduit 6 is Low and the gas mixture is heated up rapidly when transferred to the susceptor 2. When the gas mixture is rapidly heated as described above, high quality single, silicon carbide crystals cannot be obtained.

Therefore, the temperature of the gas mixture should be increased in the inlet conduit 6 to a predetermined temperature and then supplied to the susceptor 2. However, when the temperature of the gas mixture is 500° C. or more, Si deposits may form on the wall surface of the inlet conduit 6. When the gas mixture is heated to a temperature where Si and C react with each other, SiC deposits may form on the wall surface of the inlet conduit 6. The deposits may obstruct the inlet conduit 6.

Furthermore, there is the possibility that, in a path 8, at an upper surface of the susceptor, which is narrow or in a path 9, which communicates with the outside of the upper chamber, Si which remains in the mixture gas or SiC as a product by reaction may deposit and block those paths.

The present invention addresses the above-mentioned problems, and an object thereof is to provide a manufacturing method of single silicon carbide crystals that is capable of preventing blockage caused by the mixture gas, and as another of its objects to provide an apparatus for the same.

SUMMARY OF THE INVENTION

An object of the present invention is to provide a manufacturing method for producing silicon carbide crystal using source gases capable of preventing blockage due to a gas mixture. A second object of the present invention is to provide an apparatus for providing the same.

According to a first aspect of the present invention, the method is characterized in that a temperature gradient occurs in an inlet conduit for introducing a gas mixture so that the temperature of the inlet conduit rises toward a portion of the inlet conduit that is closest to the crucible.

With this method, the mixture gas is not heated rapidly after it is introduced into the crucible. The mixture gas, which is heated up when passing through the inlet conduit, is introduced into the conduit. Therefore, silicon carbide single crystals having good quality are formed.

Even if the mixture gas is heated up to a temperature at which Si or SiC or the like can deposit in the crucible, when the mixture gas moves to a portion of the inlet conduit that is at a temperature that is greater than a temperature at which Si and SiC can sublime, the deposit is prevented.

In the present invention, the temperature gradient is such that the mixture gas moves to a portion having higher temperature, and the volume of the mixture gas expands, so that the velocity of the mixture gas in the inlet conduit increases as the temperature rises.

Therefore, the mixture gas can move to a higher temperature portion quickly, and a manufacturing method for producing silicon carbide single crystals is provided that is capable of preventing the inlet conduit from being plugged by the mixture gas.

Preferably, the inlet conduit has a hole in which the sectional area thereof decreases at locations closer to the crucible. According to this feature, since the path of the mixture gas tapers and becomes smaller toward the crucible, the velocity of the gas mixture increases as the gas mixture approaches the crucible. Therefore, the velocity of the gas mixture gas is increased more than that in a case where the sectional area of the hole in the inlet conduit is constant.

Preferably, the mixture gas is mixed with a carrier gas to be introduced into the crucible through the inlet conduit.

According to this feature, the velocity of the mixture gas is increased in the inlet conduit. Therefore, the inlet conduit is not blocked by SiC or Si deposits from the gas mixture.

Preferably, the temperature at an exhaust portion of the crucible, through which the mixture gas is exhausted from the crucible is set higher than that at an introducing portion of the crucible, through which the mixture gas is introduced into the crucible.

Since deposits caused by the mixture gas tend to form on a portion of the conduit that has a lower temperature, the exhaust portion is prevented from being plugged with the deposits by increasing the temperature at the exhaust portion.

Preferably, a movable temperature raising means and an x-ray apparatus are provided outside the crucible to reduce deposits caused by the mixture gas.

Preferably, the temperature of a room for passing the mixture gas therein that is exhausted from a growth room, where silicon carbide single crystals grow on the silicon carbide single-crystal substrate, is set lower than that of the growth room, so that deposits due to the mixture gas are formed in the room.

Deposits caused by the mixture gas tend to be formed at low temperature locations. Therefore, by forming the deposits in this room, an exhaust conduit for exhausting the mixture gas to the outside of the apparatus is prevented from being plugged with the deposits. Incidentally, since the deposits are formed on a wall of the room, a path of the gas remains unobstructed.

The apparatus of this invention has a crucible in which a silicon carbide single-crystal substrate is disposed as a seed crystal, and a mixture gas containing Si and C is introduced, so that silicon carbide single crystals grow on the silicon carbide single-crystal substrate. Specifically, an inlet conduit has a temperature gradient so that the temperature of the inlet conduit at points near the crucible is higher than that at points further from the crucible.

A first heat insulator or second heat insulator or the like may be provided at a location halfway along the inlet conduit or between the inlet conduit and the crucible to adjust the transmission of heat from the crucible to the inlet conduit.

A plurality of materials, such as graphite, quartz, or metal or the like, each of which has different thermal conductivity, can be employed in the inlet conduit to make the temperature gradient therein suitable. In this case, the graphite should be located nearest to the crucible because of its high heat resistance. Preferably, the quartz is located between the graphite and the metal.

Preferably, the sectional area of a hole formed in the inlet conduit decreases at locations closer to the crucible. Thus, the velocity of the mixture gas is increased.

Preferably, TaC is formed on an inner surface at least at an outlet portion in the inlet conduit.

Preferably, the surface roughness is regulated to be, for example, 7 μm or less.

Preferably, an inner surface of the inlet conduit may be a polished surface, or a mirror surface.

Preferably, a protrusion is formed inside the crucible, and the protrusion has a communicating path, which connects the inlet conduit to the growth room. An opening area of the communicating path is tapered and increases in the direction approaching the silicon carbide single-crystal substrate, and a wall surface of the communicating path has a convexity and concavity. With this feature, fallen deposits due to the mixture gas are trapped in the concavity, and the inlet conduit is prevented from being plugged with the dropped deposits.

Other objects and features of the present invention will become more readily apparent from a better understanding of the preferred embodiment described below with reference to the following drawings.

PREFERRED EMBODIMENT OF THE PRESENT INVENTION

First Embodiment

Figure 1:
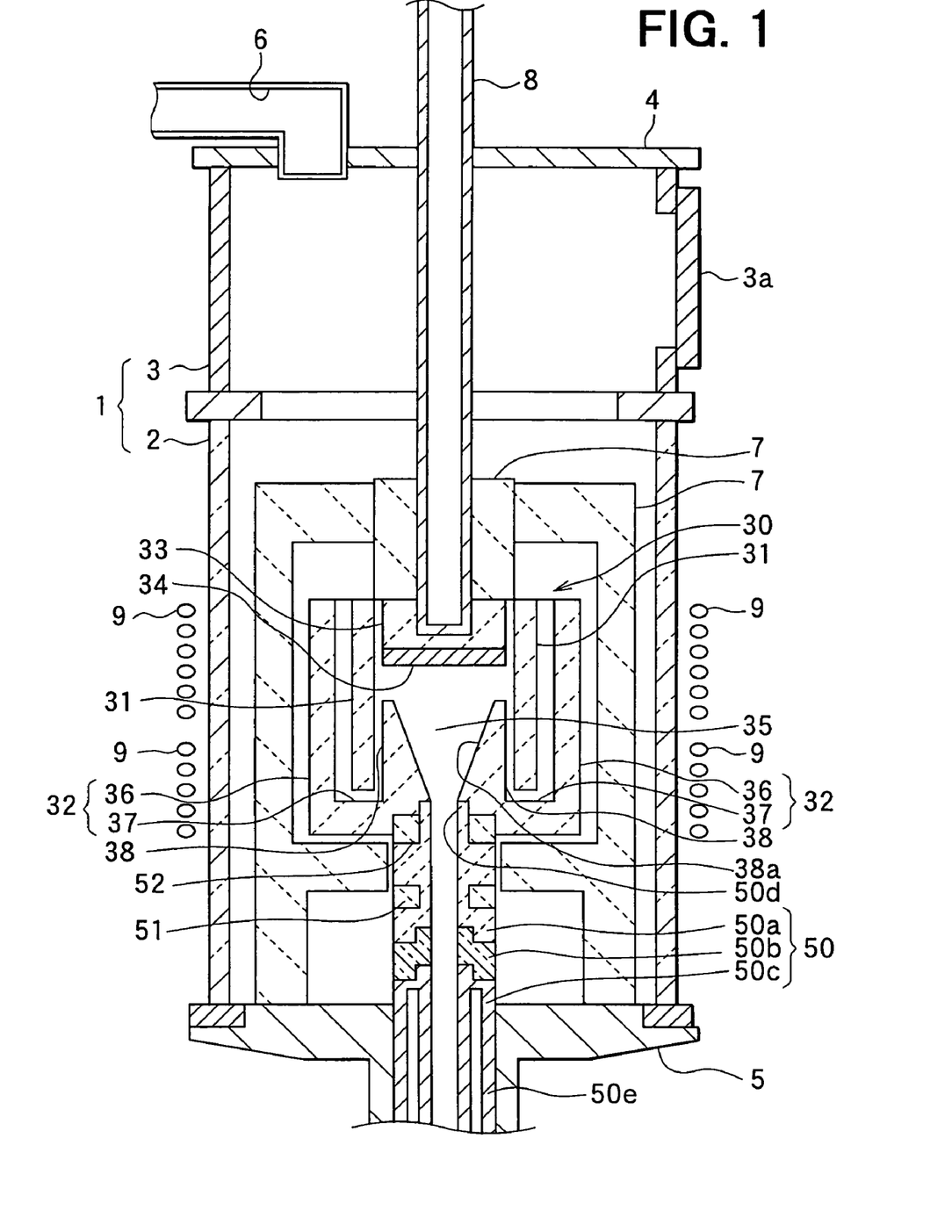
FIG. 1 is a schematic cross sectional view of a manufacturing apparatus in the first embodiment of the present invention.

FIG. 1 shows an apparatus for producing silicon carbide single crystals (hereinafter, merely referred to as the apparatus). As shown in FIG. 1, a cylindrical chamber 1 has a lower chamber 2 that is for holding a crucible, and an upper chamber 3 for removing a completed silicon carbide (SiC) so that space formed in the lower chamber 2 communicates with space formed in the upper chamber 3.

The upper chamber 3 is composed of, for example, SUS (stainless steel), and has a sample take-out port 3a for taking out SiC single crystals that have finished crystal growth. An opening at an upper side of the upper chamber 3 is covered with a top lid 4 composed of, for example, the SUS (stainless steel). An exhaust pipe 6 is connected to the top lid 4 and to a vacuum pump (not shown). An inside of the chamber 1 is controlled in pressure by the vacuum pump to create a vacuum.

The lower chamber 2 is composed of, for example, quartz, and an opening at a lower side for the lower chamber 2 is covered with a bottom lid 5 composed of, for example, SUS (stainless steel) The crucible 30 is disposed inside the lower chamber 2 and surrounded by a heat insulating material.

The crucible has first member 31 and second member 32. The first member 31 has a cylindrical body (first cylindrical member). A SiC single crystal substrate fixing pedestal 33 (hereinafter, merely referred to as a pedestal) is disposed at a side close to the upper chamber 3 inside the first member 31 so that gap is formed between the pedestal 33 and inner wall of the upper chamber 3. A silicon carbide single crystal substrate 34 is fixed on one surface of the pedestal 33. The SiC single crystals grow on the silicon carbide single crystal substrate 34, which serves as a seed crystal, in a space 35 provided inside the first member 31. Hereinafter, the silicon carbide single crystal substrate 34 is referred to as a seed crystal, and the space 35 inside the first member 31 is referred to as a growth room.

The second member 32 has a cylindrical body (second cylindrical member) 36 and a wall 37. The wall 37 is provided at an end located opposite from the upper chamber 3 in the cylindrical body 36. A protrusion 38 is provided at a center portion of a wall 37 in the second member 32. The protrusion 38 is provided to protrude inside the second cylindrical body 36, and a communicating path 38a, which connects the inside of the second cylindrical body 36 to the outside of second member 32, is formed inside the protrusion 38. The communicating path 38a is tapered such that the opening area of the communicating path 38a increases at locations closer to the pedestal 34. The first member 31 is disposed inside the second member 32 described above. More specifically, the first member 31 is located between the second cylindrical body 36 and the protrusion 38, and a gap is formed between a wall 37 and a distal portion of the first member that is located near the wall 37. Thus, the protrusion 38 protrudes from the wall 37 toward the seed crystal 34, and a structure is provided such that the outside of the crucible 30 communicates with the growth room 35 through the communicating path 38a.

Incidentally, a portion of the first cylindrical body 31 at the side of the upper chamber 3 and a portion of the second cylindrical body 36 at the side of the upper chamber 3 are connected with each other and united with each other.

Such the crucible 30 is constituted as follows. The crucible 30 has a cylindrical member corresponding to the first member 31 a cup-shaped member corresponding to the second member 32. The cylindrical member is disposed inside the cup-shaped member. An end portion at an upper side of the cup-shaped member and one end portion of the cylindrical member are positioned in the same plane, and a gap is formed between the other end portion of the cylindrical member and a bottom of the cup-shaped member. The protrusion 38 is formed approximately at a center of a bottom of the cup-shaped member corresponding to the second member 32 to protrude toward the upper end of the cup-shaped member, and the communicating path 38a, which communicates with the outside of the crucible 30 and a space (growth room 35) formed inside a cylindrical body corresponding to the first member 31, is formed in the protrusion 38.

Highly pure, graphite capable of withstanding high temperature (for example, approximately 2400° C.), can be employed as material for the first member 31. Use of the highly pure graphite, reduces the occurrence of impurities from the crucible 30 being taken into the crystals during growth.

On the other hand, an inlet conduit 5 is connected to the wall 37 of the second cylindrical member 36 so that the inlet conduit 50 communicates with the growth room 35. The mixture gas for crystal growth of SiC is introduced to the growth room 35 through the inlet conduit 50 and the communicating path 38.

The inlet conduit 50 is constituted such that a temperature gradient occurs so that the temperature of the inlet conduit 50 increases towards locations of the inlet conduit 50 that are closer to the crucible 30. In this embodiment, the inlet conduit 50 is composed of three parts. Starting from an outlet portion 50d where the mixture gas is exhausted into the growth room 35, a first inlet conduit 50a, a second inlet conduit 50b, and a third inlet conduit 50c are arranged in this order.

The first inlet conduit 50a is located at a top portion of the inlet conduit 50, where the outlet portion 50d is located, and therefore, the first inlet conduit 50a is close to the crucible 30. Accordingly, the first inlet conduit 50a is composed of material capable of withstanding high temperature such as, for example, graphite. A first thermal insulator 51 is disposed so that the temperature gradient occurs in the first inlet conduit 50a.

A second thermal insulator 52 is disposed between the first inlet conduit 50a and the crucible 30. Thus, amount of heat transferred from the crucible 30, which is heated to high temperature, to the first inlet conduit 50a, is reduced, thus the desired temperature gradient occurs in the first inlet conduit 50a.

By such a structure, the temperature at a location in the first inlet conduit 50a that is under the fist heat insulator 51 can be set at 500° C. In particular, porous graphite can be employed as a material for the first and second heat insulators 51 and 52.

The second inlet conduit 50b is provided to restrain heat conduction from the first inlet conduit 50a to the third inlet conduit 50c. Therefore, the second inlet conduit 50b is composed of a material that has low thermal conductivity such as, for example, quartz. The third inlet conduit 50c is composed of, for example, metal, more specially, SUS (stainless steel). The third inlet conduit 50c is equipped with, for example, a cooling structure that cools the third inlet conduit 50c with water, for example.

When the surface roughness Ra is defined as an average of the differences in dimension between protruding portions and hollow portions at a surface of the inside of the inlet conduit 50, as measured in a direction perpendicular to the surface thereof, the surface roughness Ra of the inner surface of the inlet conduit 50 is set at 7 μm or less, preferably 1 μm or less.

This is because, especially in the first inlet conduit 50a, the temperature of the mixture gas rises at high (for example, 500° C. or more), so that deposits of the mixture gas tend to deposit on the inner surface of the first inlet conduit 50a. Therefore, when the surface roughness Ra is limited, the contact area is reduced where the mixture gas contacts the inner surface of the first inlet conduit 50a, so that the flow velocity of the mixture gas near the inner surface of the first inlet conduit 50 is prevented from being lowered. As a result, the inlet conduit 50 is prevented from being plugged.

Further, a portion of the inlet conduit 50 at an opposite side of the outlet portion 50d penetrates a lower lid 5 to reach the exterior of the chamber 1. Although not shown, a mass flow controller is located at a further lower side to control the flow of the mixture gas that flows into the inlet conduit 50. Further, although not shown, a pyrometer is located under the inlet conduit 50 to measure the temperature at a surface of the SiC single crystals in the process of crystallization or at the surface of the seed crystal 34 through the inlet conduit 50.

A lifting shaft (hereinafter, merely referred to as a shaft) 8 is fixed to the side of the pedestal 33 that is opposite to the side where the seed crystal 34 is fixed, to lift the seed crystal 34 in a direction opposite to a growth direction of the SiC single crystals. The shaft 8 is tubular, a portion thereof close to the crucible 30 is composed of quartz, and a portion opposite from the crucible 30 is composed of SUS (stainless steel). A pyrometer is equipped at an upper side of the shaft 8 to measure the temperature of the pedestal 33. The shaft 8 is also surrounded with the heat insulator 7 in the neighborhood of the crucible 30.

A temperature raising means 9 is provided outside the chamber 1, and is located at the same level as the crucible 30. An RF (Radio Frequency) coil 9 is employed as the temperature raising means 9. In this embodiment, the RF coil has an upper coil and a lower coil, which are independent of each other, so that the temperature of an upper portion of the chamber 1 is controlled independently from that of a lower portion of the chamber 1. In addition, although not shown, an x-ray apparatus is disposed outside the chamber 1.

Next, a manufacturing method of SiC single crystals, which is performed using such the manufacturing apparatus, will be explained. First, the seed crystal 34 is fixed on the surface of the pedestal 33. The seed crystal 34 is located at a predetermined position inside the growth room 35 with the shaft 8.

Next, a vacuum is created inside of the chamber 1 while Ar gas is introduced through the inlet conduit 50. After that, the crucible 30 is inductively heated by applying electrical power to the RF coil 9. Then, the temperature of the crucible 30 is stabilized at a predetermined temperature (above 1420° C. that is a temperature at which Si melts, preferably approximately at 2400° C., at which SiC can sublime), and the pressure in the crucible 30 is set at a predetermined pressure. Since the crucible 30 is surrounded with the heat insulator 7, the crucible 30 is set at a high, uniform temperature easily. The temperature gradient occurs in the inlet conduit 50 so that temperature therein is higher at the portion of the inlet conduit 50 that is closer to the crucible 30. More specifically, the temperature gradient in the inlet conduit 50 is 100° C./cm or more on average from an end portion of the inlet conduit that is disposed at the crucible 30 to a portion at 500° C. in the inlet conduit 50. This temperature gradient may be further steep, i.e., it may be 500° C./cm or more.

In this embodiment, the first and second heat insulators 51 and 52 are disposed at the crucible 30. The porous graphite is capable of withstanding high temperatures and is porous; thus, the porous graphite is prevented from being inductively heated up by the RF coil 9. Therefore, by employing the porous graphite as the heat insulators 51 and 52, the desired temperature gradient occurs in the inlet conduit 50. Incidentally, the temperature at a portion in the first inlet conduit 50a under the first heat insulator 51 is set approximately at 500° C.

The mixture gas is introduced into the crucible 30 with carrier gas through the inlet conduit 50. The mixture gas includes a gas containing Si and a gas containing C. In particular, $SiH_4$, $C_3H_8$, $H_2$, and $N_2$ are used as the mixture gas.

In these gases, $SiH_4$ and $C_3H_8$ are the gases for forming SiC single crystals. Moreover, $H_2$ forms hydrocarbon by combining with excess carbons at a surface of SiC single crystal so that $H_2$ prevents the surface of SiC single crystal from being carbonized. Moreover, $N_2$ is a dopant gas and introduced to form n-type conductive SiC. Incidentally, trimethylaluminium gas or the like is used and introduced Al to form p-type conductive SiC.

Incidentally, the carrier gas is used for increasing gas flow in the inlet conduit 50, and Ar is employed, for example, as the carrier gas.

As described above, by introducing the mixture gas into the crucible 30 through the inlet conduit 50 where the temperature gradient occurs, the mixture gas is not heated up rapidly after being introduced into the crucible 30. Therefore, silicon carbide single crystals having high quality can be formed.

In this case, when the temperature of the mixture gas rises and exceeds such a degree as 500° C., there is possibility that Si will be deposited on the inner surface when $SiH_4$ bumps against the inner surface of the inlet conduit 50. However, the depositions thereof are prevented if the mixture gas is transferred to a high temperature region of the inlet conduit at which the temperature thereof is a sublimation point or a melting point of Si and SiC, and sublimation occurs before the depositions thereof occur. The temperature at the high temperature region of the inlet conduit described above is 1800° C., at which SiC can sublime.

In this embodiment, the mixture gas is transferred to a higher temperature region by producing the temperature gradient in the inlet conduit 50. The volume of the mixture gas is expanded as the temperature thereof rises. Therefore, the flow velocity of the mixture gas increases as the temperature thereof rises. Moreover, since the carrier gas is mixed with the mixture gas, the flow velocity in the inlet conduit 50 can be faster.

More specifically, the flow velocity of the mixture gas at the end portion of the inlet conduit 50 that is disposed at the crucible 30 is preferably 50 cm/s or more, and, more desirably, 500 cm/s or more.

As described above, the mixture gas can be transferred to the higher temperature region, so that the inlet conduit 50 is prevented from being plugged with the mixture gas.

Incidentally, the mixture gas that is introduced into the crucible 30 through the inlet conduit 50 is crystallized on the seed crystal or the SiC single crystal that has already been formed on the seed crystal. The crystallinity of the SiC single crystals varies based on the crystallinity of the seed crystal 34 or a condition of the temperature in the crucible 30 or the like, so that the SiC single crystals grow as 4H—SiC or 6H—SiC or the like.

After that, the mixture gas passes through the gap between the protrusion 38 and the first member 31, the gap formed between the distal portion of the first member 31 and the wall 37 of the second member 32 (the bottom of the cup-shaped member), and the gap between the outer wall of the first member 31 and the inner wall of the second cylindrical portion 36. Then, the mixture gas is exhausted to the outside of the crucible 30.

Generally, deposits (for example, deposits that are composed of solidified ingredients of polycrystalline silicon or the like in the mixture gas) caused by the mixture gas tend to accumulate where the temperature is lower than other portions. Therefore, in this embodiment, by adjusting the output of each independent RF coil, the temperature of the mixture gas exhausted from the crucible at an exhaust portion of the crucible 30 is higher than that of the mixture gas introduced into the crucible 30 at an introducing portion of the crucible 30. Incidentally, in the embodiment shown in the drawing, the introducing portion refers to a portion in the wall 37 that is connected to the inlet conduit 50, and the exhaust portion refers to the gap formed with first member 31 and the second cylindrical body 36.

As described above, the exhaust portion is prevented from being plugged with the deposits caused by the mixture gas when the mixture gas is exhausted from the crucible 30 by raising the temperature at the exhaust portion. Namely, since SiC vapor pressure becomes high at a high temperature location, polycrystalline silicon is prevented from being deposited on the exhaust portion so that the gas is exhausted from the crucible 30 smoothly.

Then, when the crystal growth is stopped, the mixture gas is stopped being supplied and the temperature is lowered by decreasing the electrical power supply of the RF power. After that, the SiC single crystal is transferred to the upper chamber 3, and the pressure in the upper chamber 3 is raised to atmospheric pressure. Then, the SiC single crystal is taken from the sample take-out port 3a.

As described above, a blockage due to the mixture gas at the inlet conduit 50, and a blockage due to the mixture gas at the exhaust portion are prevented, so that SiC single crystals are grown.

Incidentally, during the crystal growth, the temperature of the seed crystal 34 or the SiC single crystals is measured by the pyrometer equipped beneath the inlet conduit 50, and the temperature can be set lower than that of the crucible 30. Therefore, although change in temperature caused by an the arrangement of the crucible 30 and the pedestal 33 or by deterioration with heat may occur, the mixture gas can be crystallized on the surface of the seed crystal 34 or the SiC single crystals at constant temperature.

Since an opening of the communicating path 38a that is located near the growth room 35 is larger than that of the communicating path 38a that is located near the inlet conduit 50, the flow velocity of the mixture gas can be slower around the seed crystal 34. Thus, the mixture gas can stay around the seed crystal 34 for a long time, so that more $SiH_4$ and $C_3H_8$ in the mixture gas can be contributed to form SiC single crystals.

Since the deposits are prevented from being formed at the inlet conduit 50 or the exhaust portion of the crucible 30, more of the mixture gas is used for the growth of SiC single crystals.

Incidentally, in the manufacturing apparatus described above, the pedestal 33 is connected to the shaft 8 so that the pedestal 33 can be lifted in an upward direction (the direction of the upper chamber 3) according to the progress of the crystal growth of SiC single crystals. Therefore, the crystals can grow long successively.

Second Embodiment

Figure 2:
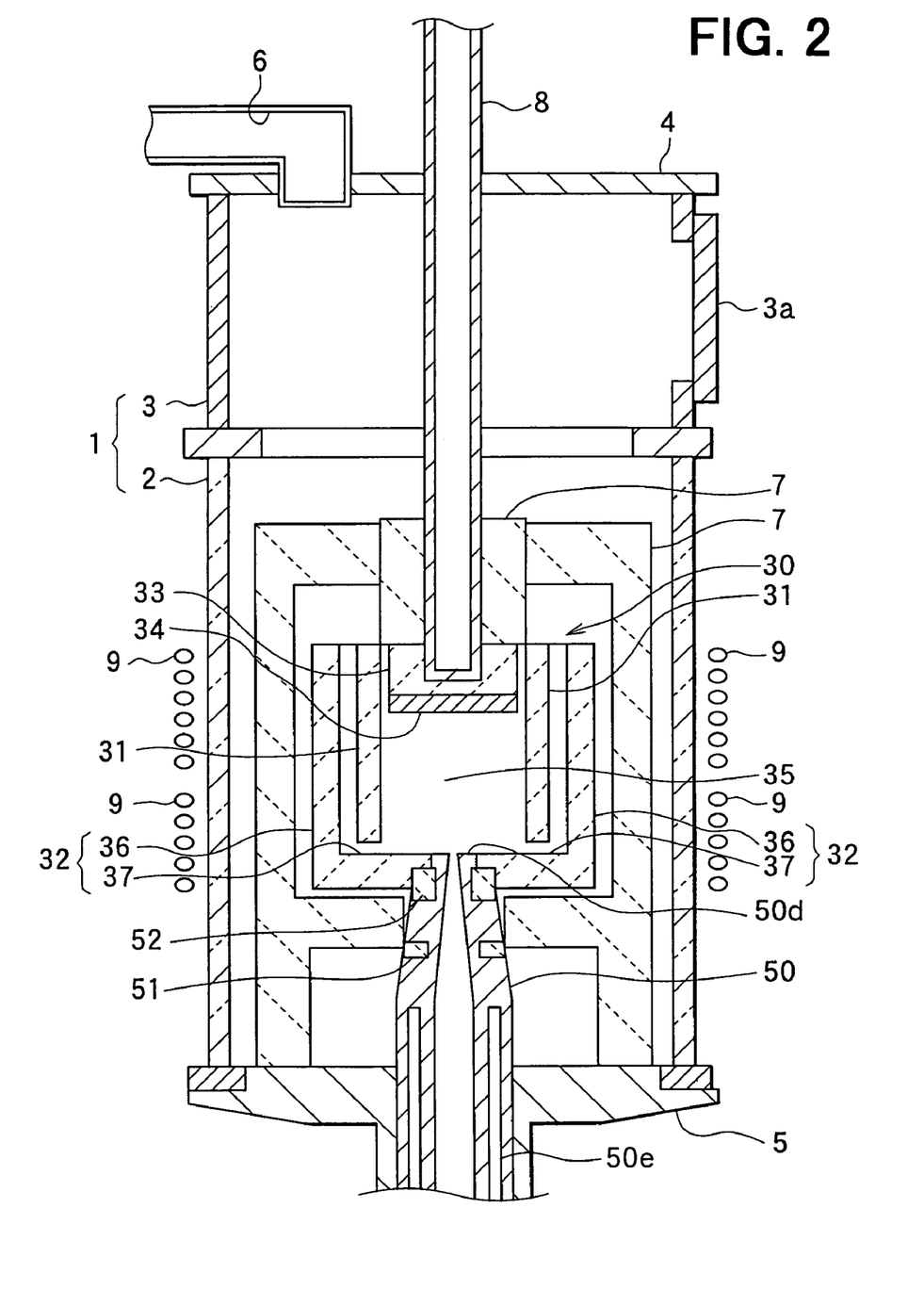
FIG. 2 is a schematic cross sectional view of a manufacturing apparatus in the second embodiment of the present invention.

FIG. 2 shows a schematic cross sectional view of a manufacturing apparatus according to a second embodiment. Parts that differ from the first embodiment are described mainly, the same component parts are designated by the same reference numerals, and a description thereof is omitted.

In this embodiment, an inlet conduit 50 is different in shape of an end portion thereof from that in the first embodiment. As shown in FIG. 2, the sectional area of an inlet conduit 50 decreases at locations closer to the crucible 30.

Thus, since the path of the mixture gas is tapered and becomes smaller as it approaches the crucible 30, the flow velocity of the mixture gas increases as the mixture gas approaches the crucible 30. Therefore, in comparison with a case in which the sectional area of hole in the conduit 50 is constant, as in the first embodiment, the flow velocity of the mixture gas can further increase at an end portion of the inlet conduit 50, so that blockage caused by the mixture gas in the inlet conduit 50 is prevented.

The inlet conduit 50 in this embodiment is not constructed with three different parts as in the first embodiment, but is constructed with one or two parts. In addition, a first heat insulator 51 is provided at a location halfway along the inlet conduit 50. Moreover, a second heat insulator 52 is provided between the crucible 30 and the inlet conduit 50. By constructing the apparatus in the manner described above, the desired temperature gradient occurs in the inlet conduit 50.

Incidentally, although the inlet conduit 50 in this embodiment is constructed with one or two parts, preferably, the surface roughness of an inner surface of the inlet conduit 50 is controlled in the manner of the first embodiment at the portion having the temperature gradient. More specifically, since deposits tend to be formed at locations where the temperature exceeds such a degree at 500° C., the temperature should preferably be controlled.

Incidentally, a protrusion 38a is not provided in the crucible 30. Even without the protrusion, SiC single crystals are produced sufficiently.

Further, the gap formed between a wall 37 and a distal portion of the first member 31 is narrowed to such a degree that the flow rate of the gas is limited. Therefore, the mixture gas in the growth room 35 tends not to be exhausted from the crucible 30. As a result, the mixture gas stays in the growth room 35 for a long time, so that more SiC single crystals are crystallized and grown from the mixture gas.

With regard to the surface roughness Ra of the inner surface of the inlet conduit 50, it is not necessary to control the roughness of the entire portion where the temperature gradient occurs. However, it is preferable to control the roughness of at least an exit 50d, where the sectional area of the hole in the inlet conduit 50 is smallest and where deposits tend to occur.

Third Embodiment

Figure 3:
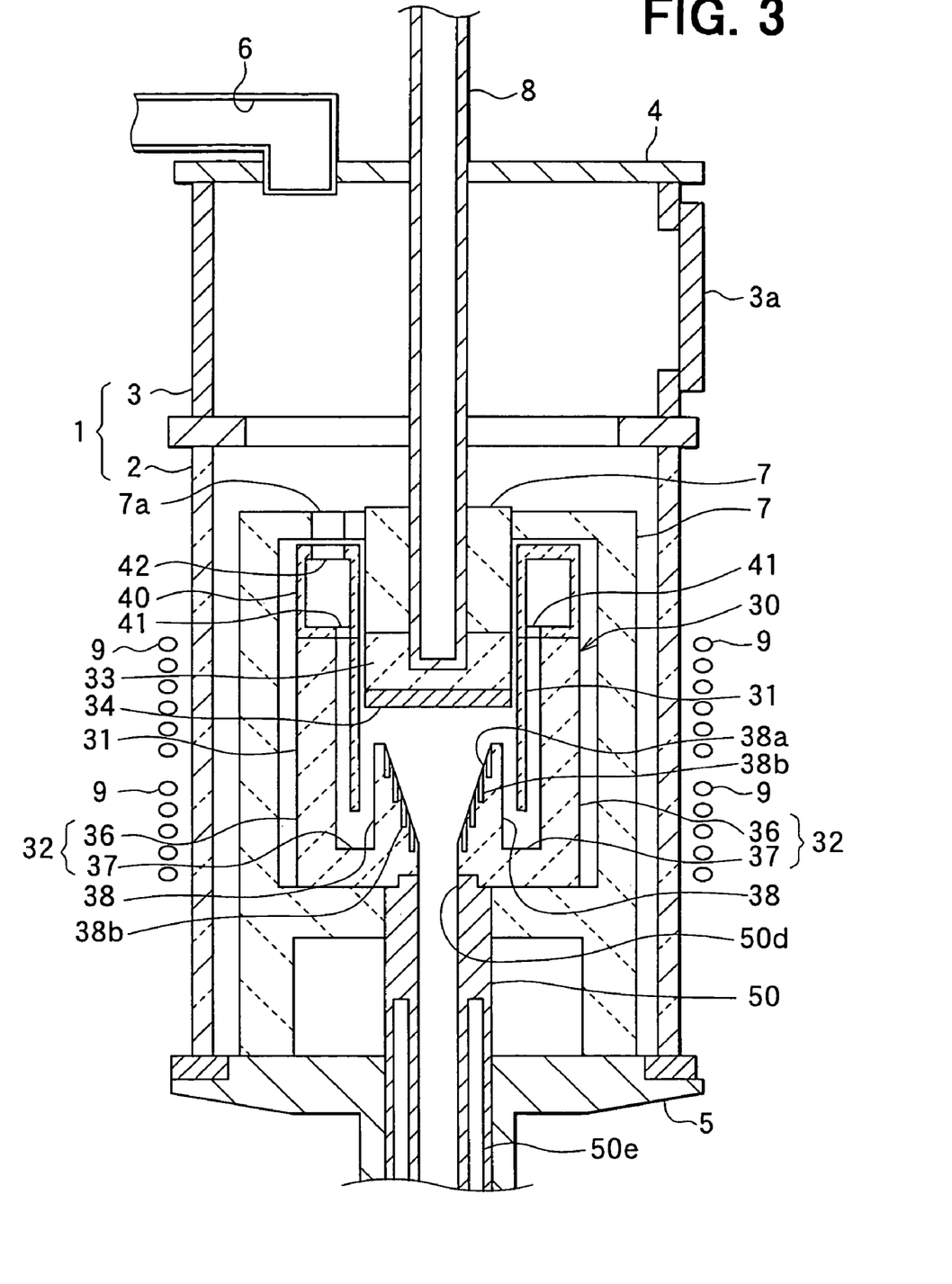
FIG. 3 is a schematic cross sectional view of a manufacturing apparatus in the third embodiment of the present invention.

FIG. 3 shows a schematic cross sectional view of a manufacturing apparatus according to a third embodiment. Hereinafter, parts that differ from the first embodiment are described mainly, and the same component parts are designated by the same reference numerals, and a description thereof is omitted.

In this embodiment, a protrusion 38 is different in the shape of a wall surface of a communicating path 38a from that in the first embodiment. As shown in FIG. 3, the wall surface of the communicating path 38a has a concavity and concavity. More specifically, slot-shaped grooves 38b are formed to face a seed crystal 34.

Generally, when a mixture gas is supersaturated in the growth room 35, the mixture gas 30 bumps against a wall of the crucible 35, so that deposits are formed on this wall. When the mixture gas is supplied through the communicating path 38a of the protrusion 38 protruding toward the seed crystal 34 in the crucible 30, there is possibility that deposits formed on the wall surface of the communicating path 38a will fall and block the inlet conduit 50.

However, in this embodiment, by providing the grooves 38b in the wall surface of the communicating path 38a, the deposits are trapped in the grooves 38b, so that the inlet conduit 50 is prevented from being plugged with the dropped deposits. The deposits trapped in the grooves 38b may be sublimed and used for growth of SiC. Alternatively, steps may be formed on the wall surface of the communicating path 38a instead of the grooves 38b.

In this embodiment, as shown in FIG. 3, a gas trap 40 is provided near the upper chamber 3 as a room for passing the gas exhausted from the growth room 35 through. The gas trap 40 is lower in temperature in comparison with the growth room 35. Furthermore, in the gas trap 40, an opening 41, which communicates with an exhaust portion of the crucible 30, is formed on one face located at a side close to the crucible 30, and an opening 42 is formed on other face located at a side opposite to the crucible 30. An opening 7a is formed in a heat insulator 7 to correspond with the opening 42.

As described above, since the gas trap 40 is provided, the mixture gas exhausted from the crucible 30 passes through the gas trap 40. Since deposits due to the mixture gas tend to accumulate where the temperature is low, the deposits accumulate on the gas trap 40. Therefore, constituents of the mixture gas are solidified so that concentration of the constituents in the mixture gas can be reduced. As a result, the exhaust conduit 6 is prevented from being plugged with the deposits.

Furthermore, since the deposits accumulate on a wall of the gas trap 40, the flow path of the gas in the gas trap 40 is remains open. The gas trap 40 may be provided as a separated body from the crucible 30 so that it can be replaced when the amount of the deposits becomes excessive.

Incidentally, in the above-mentioned embodiments, although the heat insulators 51 and 52 are provided on the inlet conduit 50 to cause the desired temperature gradient, as shown in FIG. 3, it is not necessarily to provide the heat insulators 51 and 52.

Other Embodiments

In each embodiment described above, the RF coil 9 is movable. Locations where the deposits are formed in the crucible 30 are checked using an x-ray apparatus, so that the temperature of the portions where the deposits are formed can be increased.

Thus, the deposits are sublimed by increasing the temperature thereof, so that the deposits are reduced, whereby blockage of the crucible 30 is prevented.

Moreover, TaC or the like is formed on an inner wall of the inlet conduit 50 to constitute the inner wall of the inlet conduit 50, and the surface roughness of the TaC may be controlled in the manner described above. In particular, as in the first embodiment, when a surface roughness Ra of the inner surface of a portion in the inlet conduit 50 that is composed of graphite is controlled, it is preferable that TaC is formed on the inner surface and the surface roughness Ra of the inner surface is controlled.

Further, the surface roughness Ra of an end portion of the inlet conduit 50 (for example, that is composed of graphite) can be controlled, or the surface roughness Ra of the entire inner surface of the inlet conduit 50 can be controlled.

Further, in the above-mentioned embodiments, although Ar gas is employed as the carrier gas, inert gas such as He or the like can be employed in addition to Ar gas. Furthermore, although $H_2$ gas is included in the mixture gas, $H_2$ gas may be employed as a carrier gas. Since both $H_2$ and He have high thermal conductivity in comparison with $SiH_4$ and $C_3H_8$, these gases can absorb heat on the seed crystal 34 or the SiC single crystals when they reach the seed crystal 34. Therefore, the surface of the seed crystal 34 or the SiC single crystals is cooler in comparison with the crucible 30, and the crystal growth of SiC is encouraged.

EXAMPLE

First, the seed crystal 34 was fixed to the pedestal 33, and disposed at a predetermined place in the crucible 30. At that time, the seed crystal was disposed so that a (0 0 0 1) Si face of 6H—SiC faces the growth room 35.

Then, a vacuum was created in the chamber 1, and Ar was introduced into the chamber 1 at a rate of 10 liters per minute through the inlet conduit 50. Electrical power was supplied to the RF coil 9, so that the crucible was heated to 2400° C.

After that, when temperature of the crucible 30 became stable at 2400° C., pressure in the chamber 1 was set at $2.66 \times 10^4$ Pa, and the mixture gas and the carrier gas described above were introduced into the crucible 30 while flows thereof were controlled by the mass flow controller. The flows of $SiH_4$, $C_3H_8$, $H_2$ gas, $N_2$, and Ar were set to one liter per minute, 0.27 liters per minute, one liter per minute, 0.4 liters per minute, and 5 liters per minute, respectively.

During the crystal growth, the surface temperature of the seed crystal 34 or the SiC single crystals grown on the seed crystal 34 were measured by the pyrometer disposed beneath the inlet conduit 50, and controlled to be at 2350° C. The temperature distribution and gas concentration distribution were made uniform at the surface of the seed crystal 34 or the SiC single crystals grown on the seed crystal 34 by rotating the shaft 8.

When one hour passed after starting the crystal growth, the crystal growth amount was monitored by observing a transmission image of the crucible 30 using an x-ray apparatus. As a result, the growth rate was at 1.5 mm/hour based on the growth amount. The crystal growth was continued while the shaft 8 was lifted according to the growth rate.

The crystal growth was performed for 40 hours as described above. Then, the supplies of $SiH_4$, $C_3H_8$, $H_2$ gas, $N_2$, and Ar gases were stopped, and the temperature was decreased by lowering the electric power of the RF coils. After that, the SiC single crystals was transferred to the upper chamber 3, and pressure in the upper chamber 3 was increased to atmospheric pressure. Then, the SiC single crystals were taken from the sample take-out port 3a.

After the experiment described above, the growth amount of the SiC single crystals was measured to be 57 mm. An ingot of the SiC single crystals had a temperature distribution and gas concentration distribution that was symmetrical with respect to a center thereof since the ingot had a facet of a (0 0 0 1) face at a grown surface thereof.

A wafer having a thickness of 500 µm was sliced from the SiC single crystals and was polished. The characteristics of the SiC wafer were checked using Raman scattering spectroscopy, and the wafer had a poly type of 6H—SiC. In addition, the emission distribution on a plane of the wafer was checked by radiating a He—Cd laser (325 nm) to the SiC wafer. The SiC wafer had the same poly type of 6H—SiC at the entire surface thereof.

While the present invention has been shown and described with reference to the foregoing preferred embodiments, it will be apparent to those skilled in the art that changes in form and detail may be therein without departing from the scope of the invention as defined in the appended claims.

What is claimed is:

1. A manufacturing method for producing silicon carbide single crystals, comprising:
   providing a silicon carbide single-crystal substrate as a seed crystal in a crucible;
   introducing a mixture gas having a gas including Si and a gas including C into said the crucible, whereby silicon carbide single crystals grow on said the silicon carbide single-crystal substrate, wherein
   an inlet conduit is provided for introducing the mixture gas into the crucible and
   includes a heat insulator in a circumferential groove on an outer surface for producing a temperature gradient, and
   a temperature gradient, which is measured from an outlet end of the inlet conduit to an inlet end of the inlet conduit, is such that a downstream temperature is higher than an upstream temperature.

2. A manufacturing method for producing silicon carbide single crystals according to claim 1, wherein:
the inlet conduit has a cross-sectional area that becomes smaller as the inlet conduit approaches the crucible.

3. A manufacturing method for producing silicon carbide single crystals according to claim 1, wherein:
a temperature gradient in the inlet conduit is set at 100° C./cm or more on an average from the outlet end in the inlet conduit that is adjacent to the crucible to a portion at 500° C. in the inlet conduit.

4. A manufacturing method for producing silicon carbide single crystals according to claim 1, wherein:
a temperature gradient in the inlet conduit is set at 500° C./cm or more on an average from the outlet end in the inlet conduit that is adjacent to the crucible to a portion at 500° C. in the inlet conduit.

5. A manufacturing method for producing silicon carbide single crystals according to claim 1, wherein:
a flow velocity of the mixture gas at the outlet end of the inlet conduit that is adjacent to the crucible is set at 50 cm/s or more.

6. A manufacturing method for producing silicon carbide single crystals according to claim 1, wherein:
a flow velocity of the mixture gas at the outlet end of the inlet conduit that is adjacent to the crucible is set at 500 cm/s or more.

7. A manufacturing method for producing silicon carbide single crystals, comprising:
providing a silicon carbide single-crystal substrate as a seed crystal in a crucible;
introducing a mixture gas having a gas including Si and a gas including C into the crucible, whereby silicon carbide single crystals grow on the silicon carbide single-crystal substrate, characterized in that:
the mixture gas is mixed with a carrier gas, and the mixture gas and the carrier gas are then introduced into crucible through an inlet conduit including a heat insulator in a circumferential groove on an outer surface of the inlet conduit for introducing the mixture gas into the crucible.

8. A manufacturing method for producing silicon carbide single crystals according to claim 7, wherein:
a flow rate including the mixture gas and the carrier gas in the inlet conduit is bigger than that of a gas composed only of the mixture gas in the inlet conduit.

9. A manufacturing method for producing silicon carbide single crystals according to claim 7, wherein:
the carrier gas is composed at least one of hydrogen and inert gas.

10. A manufacturing method for producing silicon carbide single crystals comprising:
providing a silicon carbide single-crystal substrate as a seed crystal in a crucible;
introducing a mixture gas having a gas including Si and a gas including C into the crucible, whereby silicon carbide single crystals grow on the silicon carbide single-crystal substrate,
wherein a temperature at an exhaust portion of the crucible through which the mixture gas is exhausted from the crucible is set higher than that at an introducing portion of the crucible through which the mixture gas is introduced into the crucible.

11. A manufacturing method for producing silicon carbide single crystals, comprising:
providing a silicon carbide single-crystal substrate as a seed crystal in a crucible;
introducing a mixture gas having a gas including Si and a gas including C into the crucible, whereby silicon carbide single crystals grow on the silicon carbide single-crystal substrate;
checking a portion in the crucible where deposits caused by the mixture gas are formed using an x-ray apparatus provided outside of the crucible; and
raising a temperature of the portion in the crucible with a temperature raising means provided outside of the crucible, which is movable with respect to the crucible, by shifting the temperature raising means.

12. A manufacturing method for producing silicon carbide single crystals, comprising:
providing a silicon carbide single-crystal substrate as a seed crystal in a crucible, whereby silicon carbide single crystals grow on the silicon carbide single-crystal substrate; and
passing the mixture gas through a trap for solidifying constituents of the mixture gas, wherein the mixture gas is exhausted from a growth room where growth of silicon carbide single crystals on the silicon carbide single-crystal substrate is performed in the crucible, wherein a temperature of the trap is set lower than that of the growth room.

13. A manufacturing method for producing silicon carbide single crystals according to claim 12, wherein the trap is provided as a separated body from the crucible so that the trap is able to be replaced.

14. A manufacturing method for producing silicon carbide single crystals according to claim 12, wherein the trap has an inlet opening communicating with the growth room and an outlet opening communicating with an exhaust conduit that opens to an outside, and at least the outlet opening of the trap is surrounded by a heat insulator.

* * * * *